United States Patent
Fukushima

(10) Patent No.: US 9,296,560 B2
(45) Date of Patent: Mar. 29, 2016

(54) STORAGE DEVICE AND STORAGE METHOD

(75) Inventor: Masazumi Fukushima, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 166 days.

(21) Appl. No.: 14/125,275

(22) PCT Filed: May 17, 2012

(86) PCT No.: PCT/JP2012/062613
§ 371 (c)(1),
(2), (4) Date: Dec. 10, 2013

(87) PCT Pub. No.: WO2013/001930
PCT Pub. Date: Jan. 3, 2013

(65) Prior Publication Data
US 2014/0124331 A1    May 8, 2014

(30) Foreign Application Priority Data
Jun. 28, 2011    (JP) ................. 2011-142651

(51) Int. Cl.
*B65G 1/00* (2006.01)
*B65G 1/04* (2006.01)
*H01L 21/673* (2006.01)
*H01L 21/677* (2006.01)

(52) U.S. Cl.
CPC ............ *B65G 1/04* (2013.01); *H01L 21/67389* (2013.01); *H01L 21/67769* (2013.01)

(58) Field of Classification Search
CPC ................................................ H01L 21/67769
USPC ..................................................... 198/347.1
See application file for complete search history.

(56) References Cited

U.S. PATENT DOCUMENTS

| 4,418,646 | A | * | 12/1983 | Zajac ............................. 118/733 |
| 2002/0135966 | A1 | | 9/2002 | Tanaka et al. |
| 2006/0078407 | A1 | | 4/2006 | del Puerto |
| 2008/0023417 | A1 | | 1/2008 | Yamamoto |
| 2009/0095325 | A1 | * | 4/2009 | Choi et al. ....................... 134/24 |
| 2009/0196714 | A1 | * | 8/2009 | Sylvestre et al. .......... 414/217.1 |

FOREIGN PATENT DOCUMENTS

| DE | 10350517 A1 * | 6/2005 |
| JP | 05029184 A | 2/1993 |
| JP | 11314703 A | 11/1999 |

(Continued)

OTHER PUBLICATIONS

DE10350517—Google english translation.*
Japanese language international search report dated Jul. 24, 2012 and its English language translation issued in corresponding PCT application PCT/JP2012/062613.

(Continued)

*Primary Examiner* — Gene Crawford
*Assistant Examiner* — Lester Rushin
(74) *Attorney, Agent, or Firm* — DLA Piper LLP (US)

(57) ABSTRACT

A storage unit includes carousels each including a plurality of levels and including a plurality of spaces for storing containers on each level, the carousels rotating around a vertical shaft; a loading port for loading and unloading the containers; transport units for transporting the containers between the loading port and the storage spaces; and pipes for feeding clean gas such that feeding is turned on and off for each storage space, the pipes being configured to be connected to an intake port provided for each container.

6 Claims, 6 Drawing Sheets

(56) References Cited

FOREIGN PATENT DOCUMENTS

| JP | 2005167168 A | 6/2005 |
| JP | 2007227800 A | 9/2007 |
| JP | 4215079 B2 | 1/2009 |
| KR | 19980008776 B1 | 4/1998 |

OTHER PUBLICATIONS

Extended European search report dated Jan. 5, 2015 issued in corresponding European application No. 12804353.6.

* cited by examiner

F I G. 3
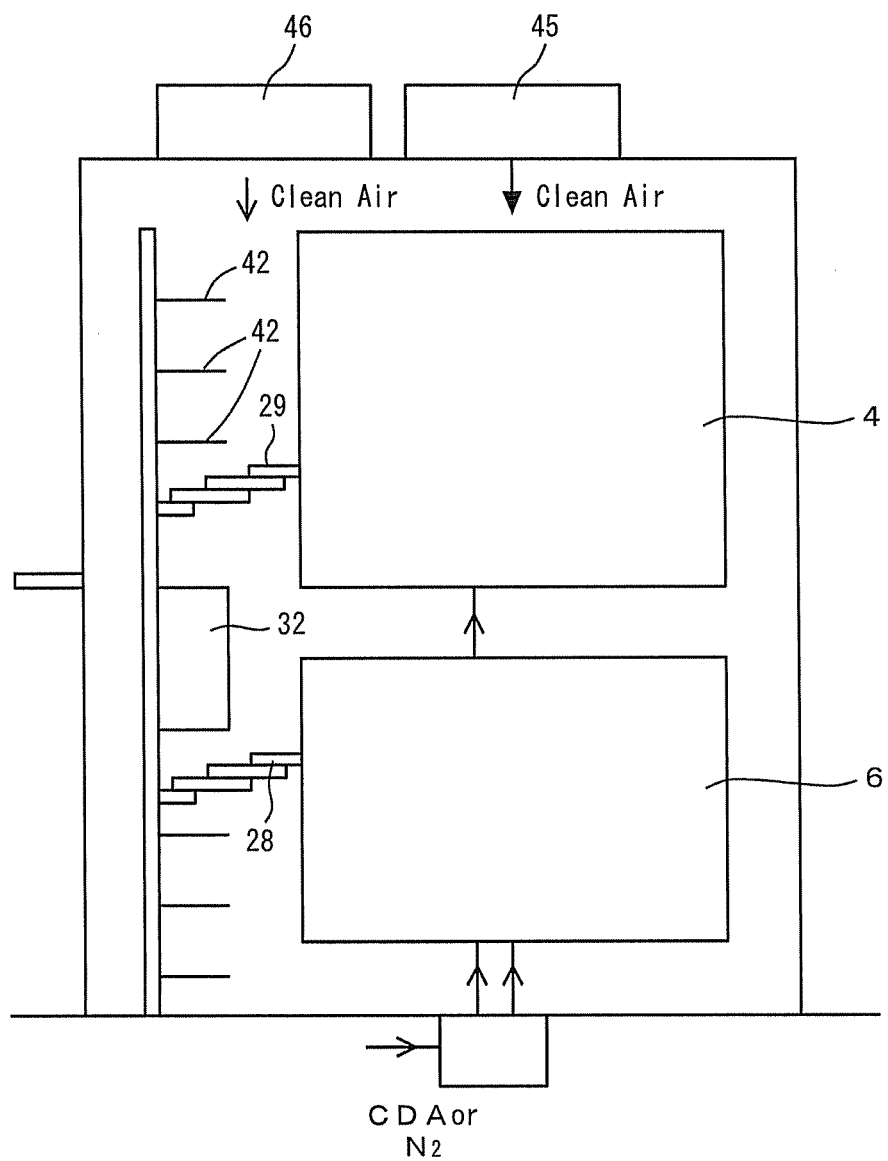

F I G. 8
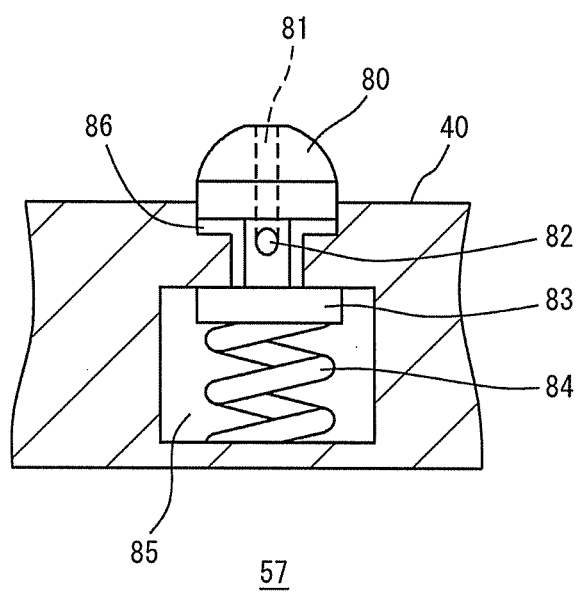

STORAGE DEVICE AND STORAGE METHOD

CROSS REFERENCE TO RELATED APPLICATIONS

This application is a national stage of international application PCT/JP2012/062613, filed on May 17, 2012, and claims the benefit of priority under 35 USC 119 of Japanese application 2011-142651, filed on Jun. 28, 2011, which are incorporated herein by reference.

BACKGROUND OF THE INVENTION

1. Field of the Invention

The present invention relates to storage units and storage methods for storing articles such as reticles and wafers.

2. Description of the Related Art

Patent Literature 1 (JP 4215079B) discloses, regarding a unit for storing articles such as reticles:

providing a reticle carousel and a pod carousel, and superposing the reticle carousel over the pod carousel;

providing two hands configured to move up and down, a pod opener, a buffer for temporary placement of a pod, and a loading port for bringing in or out the pods, and transferring the pods and reticles; and blowing clean air into the carousels in a down-flow manner.

Patent Literature 2 (JP 2008-219032A) discloses handling reticles by accommodating each reticle in a double case constituted by an inner case and an outer case (pod).

To store more delicate wafers or reticles that record a more delicate pattern, a cleaner atmosphere needs to be provided, and simply blowing clean air into carousels in a down-flow manner is insufficient. In particular, when storing reticles to be exposed with EUV (Extreme Ultra Violet) light, reticles having an extremely fine pattern, or the like, the atmosphere for storage not only needs to simply have a low dust concentration, but also needs to be chemically clean and have an extremely low moisture content.

CITATION LIST

Patent Literature

Patent Literature 1: JP 4215079B
Patent Literature 2: JP 2008-219032A

SUMMARY OF THE INVENTION

An object of this invention is to enable articles to be stored in a significantly clean gas.

A storage unit of this invention includes: a carousel including a plurality of levels and including a plurality of spaces for storing a container on each level, the carousel rotating around a vertical axis;

a loading port for loading and unloading the container;

a transport unit for transporting the container between the loading port and the container storage spaces; and a pipe configured to be connected a first valve provided at a bottom of the container for feeding clean gas such that feeding is turned on and off for each container storage space, the first valve being configured to open a flow channel for clean gas when pressure outside a container is higher than internal pressure of the container, and the pipe including, at its end, a second valve configured to open a flow channel for clean gas as a result of coming into contact with the first valve.

A storage method of this invention uses a storage unit including: a carousel including a plurality of levels and including a plurality of spaces for storing a container on each level, the carousel rotating around a vertical axis; a loading port for loading and unloading the container; a transport unit for transporting the container between the loading port and the container storage spaces; and a pipe for feeding clean gas to each container storage space, the pipe including, at its end, a second valve configured to open a flow channel for clean gas as a result of coming into contact with a first valve provided at a bottom of a container, the first valve being configured to open a flow channel for clean gas when pressure outside a container is higher than internal pressure of the container, and the method includes:

a step for transporting a container accommodating a reticle or a semiconductor wafer and including the first valve at the bottom, between the loading port and the container storage spaces by the transport unit; and a step for connecting the second valve at the end of the pipe to the first valve of the container stored in the container storage space, and feeding clean gas into the container by opening both the second valve and the first valve.

According to this invention, since the feeding of clean gas is turned on and off for each container storage space, the container can be kept clean, and clean gas will not be fed to unnecessary space. Note that clean gas means dry $N_2$ gas, CDA (Clean Dry Air: highly clean air with a low dew point), or the like, and is different from mere clean air in that the content of chemically active gas such as $SO_2$ or $NH_3$ is extremely low, and that the water vapor content is extremely low, for example, the dew point is −60° C. or lower. In this specification, the articles include not only bare articles such as reticles and semiconductor wafers, but also cases for accommodating articles to be accommodated within the containers.

It is preferable that said carousel is a first carousel, and that said storage unit further includes: a second carousel disposed above the first carousel so as to be superposed over the first carousel in a plan view, the second carousel rotating around a vertical axis independently of the first carousel, the second carousel including a plurality of levels and including a plurality of article storage spaces on each level, and the article storage spaces being able to be opened and closed; a filter fan unit for feeding clean air in a down-flow manner from above the second carousel; an opening and closing unit for bringing the article into and out of the container; a second transport unit for transporting the article between the opening and closing unit and the second carousel; a second pipe for feeding clean gas such that feeding is turned on and off for each article storage space; and a storage unit housing. With this configuration, the second carousel that is required to have a higher degree of cleanness can be surrounded by cleaner clean air, and the interior of the storage unit can be made substantially air-tight with the housing and filled with clean air. Moreover, articles can be transported between the opening and closing unit and the second carousel by the second transport unit. Articles can be kept clean by feeding clean gas by turning on and off the feeding of clean gas for each article storage space.

It is preferable that the container storage space includes a door configured to be opened and closed by a hand of the transport unit for transporting the container, the article storage space includes a door configured to be opened and closed by a hand of the second transport unit for transporting the article, and the second pipe includes a third valve for opening a flow channel for clean gas as a result of coming into contact with the article. With this configuration, clean gas can be fed upon the valve being mechanically opened, as a result of a container or an article being placed in the storage space. Moreover, the storage space can be made substantially air-tight due to provision of the door, and the door can be opened and closed by the hand.

It is particularly preferable that the second pipe and the first pipe are configured to be connected to the first valve provided in the container include rotary joints connected to a clean gas feeding source and downstream pipes branching from the rotary joints and supplying clean gas to the container storage spaces and the article storage spaces. With this configuration, even if the carousels rotate, clean gas can be easily fed to the container storage space and the article storage space.

It is most preferable that the first carousel and the second carousel include vertical shafts, and the downstream pipes extend upward from below along the shafts. With this configuration, the downstream pipe can be provided so as to extend upward from below the storage unit, so as to rotate together with the carousels.

BRIEF DESCRIPTION OF DRAWINGS

FIG. 3 is a view schematically showing an atmosphere flow in the storage unit in the embodiment.

FIG. 8 is a vertical cross-sectional view showing a mechanical valve.

DETAILED DESCRIPTION OF THE PREFERRED EMBODIMENTS

Figure 1:
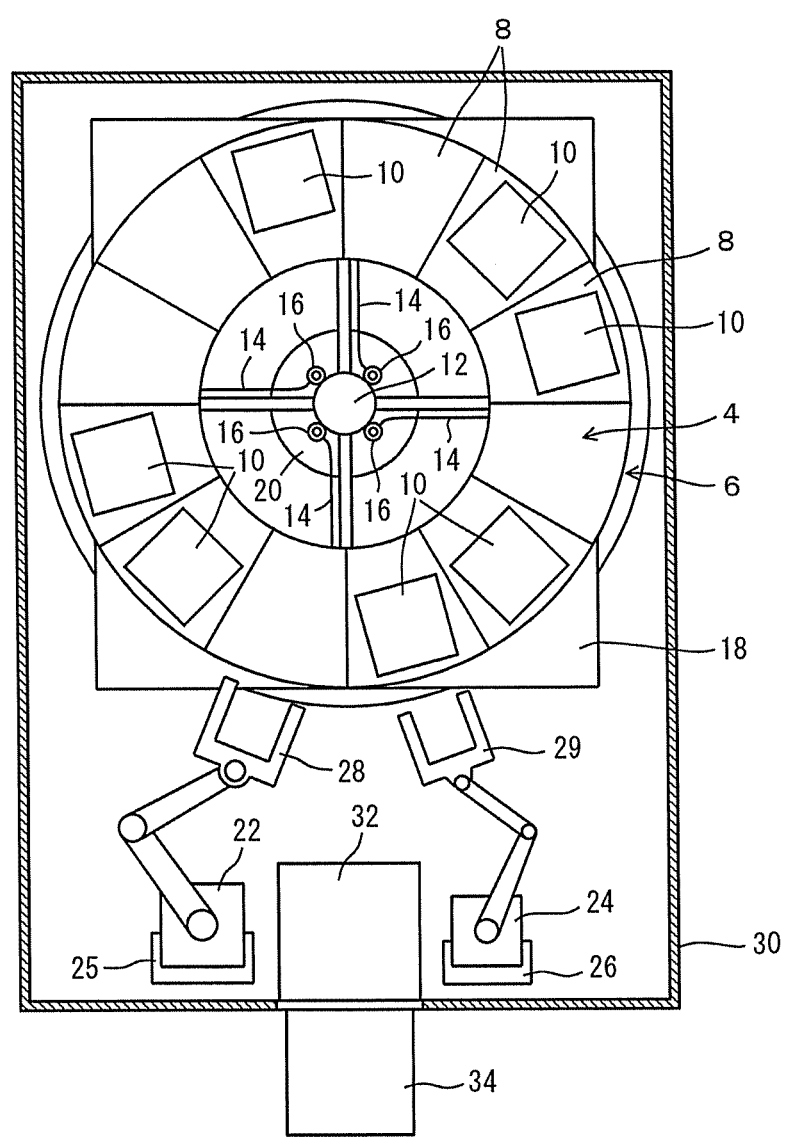
FIG. 1 is a horizontal cross-sectional view of a storage unit in an embodiment.

Hereinafter, a best embodiment for carrying out the present invention will be described. The scope of the invention is to be defined based on the description of the claims, in view of the description of the specification and well known techniques in the field of the invention, and in accordance with the understanding of a person skilled in the art.

Embodiment

FIGS. 1 to 8 show a storage unit 2 in an embodiment. In the drawings, reference numeral 4 denotes a reticle carousel, and reference numeral 6 denotes a pod carousel. Reticles (not shown) are accommodated and stored in inner cases 10, and each inner case 10 is lighter than each pod 54 and is required to have a higher degree of cleanness than the pod 54 does. For this reason, the reticle carousel 4 is disposed above the pod carousel 6 so as to be superposed over it in a plan view, and the carousels 4 and 6 are allowed to rotate independently of each other around a vertical shaft.

Figure 2:
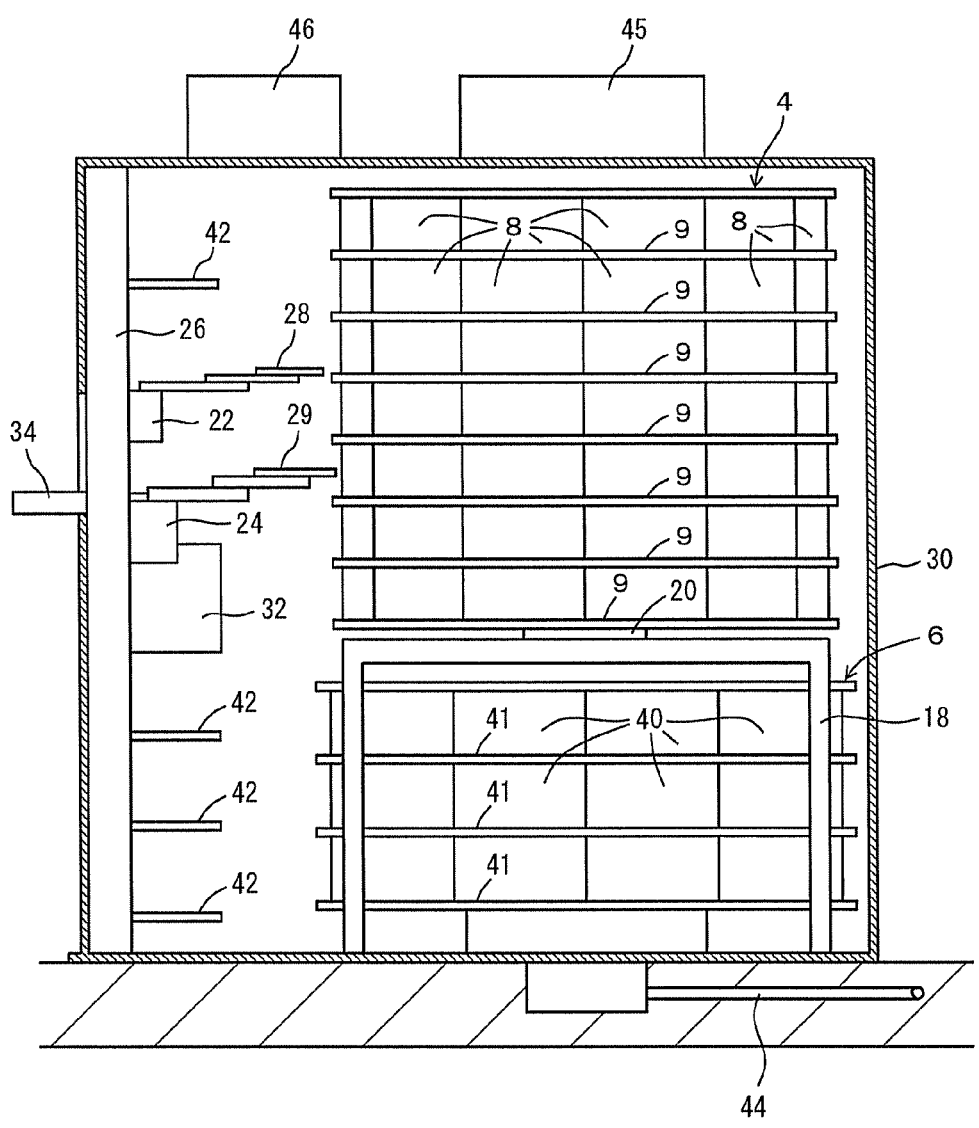
FIG. 2 is a vertical cross-sectional view of the storage unit in the embodiment.

As shown in FIG. 2, the reticle carousel 4 has a plurality of shelves 9, and a plurality of reticle storage rooms 8, each serving as an example of a reticle storage space, are radially provided on each shelf 9. The reticle carousel 4 is rotated by a vertical shaft 12 and a motor 20, and provided with air supply pipes 14 and 16 along the shaft 12 to feed $N_2$ or CDA (Clean Dry Air) to the reticle storage rooms 8. Reference numeral 18 denotes a base member of the reticle carousel 4. The air supply pipes 16 extend upward from below along the shaft 12, and feed clean gas to the air supply pipes 14.

As shown in FIG. 2, the pod carousel 6 is provided below the reticle carousel 4 and includes a plurality of shelves 41, and a plurality of pod storage rooms 40, each serving as an example of a pod storage space, are radially provided on each shelf. In addition, a pair of elevating members 22 and 24 are provided inward of an outer wall 30 of the storage unit 2 and move up and down along vertical guides 25 and 26, for example. The elevating members 22 and 24 have hands 28 and 29, respectively. The hand 28 transfers the pods 54, and the hand 29 transfers the inner cases 10. The outer wall 30 maintains the interior of the storage unit 2 in a substantially air-tight state with respect to the outside. Reference numeral 32 denotes a pod opening and closing unit, which opens and closes the pods 54 to enable the inner cases 10 to be brought in or out. Reference numeral 34 denotes a loading port, which is provided with a conveyer and the like (not shown) and transfers the pods 54 to and from overhead travelling vehicles, operators, or the like. Pod buffers 42 buffer the pods 54. The hand 28 transfers the pods 54 to and from the pod carousel 6, the pod buffers 42, the pod opening and closing unit 32, and the loading port 34. Meanwhile, the hand 29 transfers the inner cases 10 to and from the reticle carousel 4 and the pod opening and closing unit 32. Note that the pod carousel 6 is also provided with a vertical shaft (not shown), and an air supply pipe for supplying clean gas extends upward from below along this shaft. Pipes for supplying clean gas branch out from the aforementioned air supply pipe so as to extend to each pod storage room 40.

Since reticles that are stored in this embodiment are to be exposed with EUV light, the reticles are accommodated in the inner cases 10, and one inner case 10 is accommodated in each pod 54, for example. However, a plurality of inner cases 10 may be stored in each pod 54. If semiconductor wafers are stored in place of the reticles, the wafers may be stored in a bare state in the reticle storage rooms 8 without using the inner cases 10.

Reference numeral 44 denotes an air supply pipe, which feeds clean gas such as $N_2$ or CDA to the carousels 4 and 6. A pair of filter fan units 45 and 46 are provided at a ceiling of the storage unit 2, for example. The filter fan unit 45 feeds a down-flow of clean air from above the reticle carousel 4, thereby maintaining the surroundings of the carousels 4 and 6 in a clean state. The filter fan unit 46 feeds a down-flow of clean air toward the pod buffers 42, the hands 28 and 29, the pod opening and closing unit 32, and the like, thus preventing contamination when the inner cases 10 and the pods 54 are handled with the hands 28 and 29 and the pods 54 are stored at the pod buffers 42.

FIG. 3 shows the feeding of clean gas and clean air to the storage unit 2. The clean gas from the air supply pipe 44 passes through a rotary joint 48 shown in FIG. 4, or the like, is supplied by the air supply pipes 16 and the like extending upward from below along the vertical shaft or the like of the carousels 4 and 6, and is fed to each reticle storage room 8 and pod storage room 40. A down-flow of clean air is provided to the surroundings of the carousels 4 and 6 by the filter fan unit 45, and a down-flow of clean air is provided to the surroundings of the pod buffers 42 and the like by the filter fan unit 46. In this way, articles are stored in clean gas in the storage rooms 8 and 40 on the shelves 4 and 6, and the reticle carousel 4 and the pod carousel 6 are enveloped with down-flows of clean air, thus making the surroundings of the reticle carousel 4 is particularly clean. When the inner cases 10 and the pods 54 are handled with the hands 28 and 29, and when they are temporarily placed on the pod buffers 42 or the like, contamination is prevented by clean air.

Figure 4:
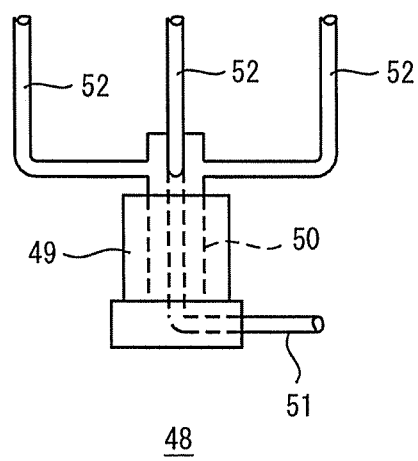
FIG. 4 is a view showing a rotary joint used in the embodiment.

FIG. 4 shows the rotary joint 48 provided at downstream of the air supply pipe 44, and the reticle carousel 4 and the pod carousel 6 are each provided with one rotary joint 48, for example. An inner member 50 is rotatably supported to an outer member 49 by a bearing or the like, an air supply pipe 51 is connected to the member 49 so as to be in communication with a vent path within the member 50, and this vent path branches into a plurality of air supply pipes 52 to supply air. The air supply pipes 52 extend along the shaft of the carousels 4 and 6 and then become the aforementioned air supply pipes 14 and 16 or the like, and extend to the individual storage rooms 8 and 40. Note that the configuration of the rotary joint 48 is arbitrary.

Figure 5:
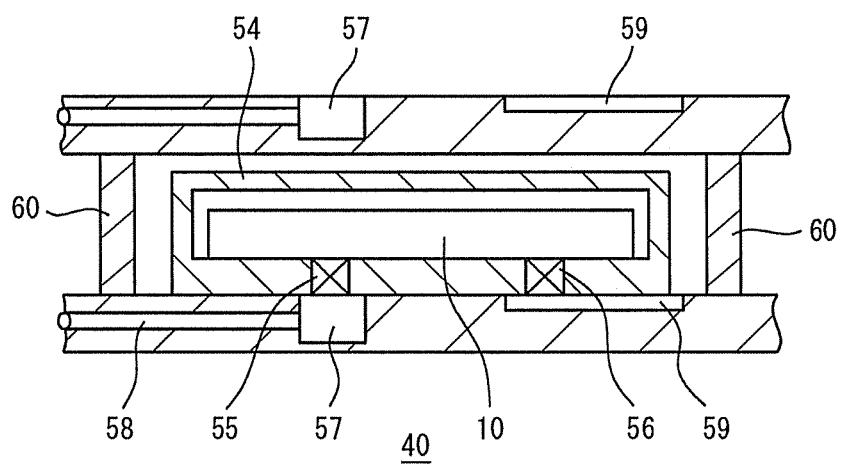
FIG. 5 is a vertical cross-sectional view showing a mechanism for supplying and discharging air to and from a pod storage room.

FIG. 5 shows the pod 54 stored in one of the pod storage rooms 40. The pod 54 has an intake valve 55 and an exhaust valve 56 at its bottom, for example, and accommodates only one inner case 10, for example, in a substantially air-tight manner. The pod storage room 40 is configured so as to be substantially air-tight as a result of being surrounded by walls 60, a door 70 shown in FIG. 7, and the like, feeds clean gas from an air supply pipe 58 and further from the valve 57 to the interior of the pod 54 via the intake valve 55. Further, the clean gas is discharged to the interior of the storage room 40 from the exhaust valve 56 via an exhaust groove 50. Note that the exhaust valve 56 and the groove 59 do not need to be provided. The valve 57 normally closes an end of the air supply pipe 58, and is mechanically opened as a result of coming into contact with the intake valve 55 to feed clean gas. The intake valve 55 opens when the pressure outside the pod 54 is higher than the internal pressure thereof to introduce clean gas, and the exhaust valve 56 opens when the internal pressure is higher than the pressure outside to discharge clean gas from the groove 59. Note that if the exhaust valve 56 is not provided, clean gas is discharged by allowing it to leak out from gaps in the pod 54.

Figure 6:
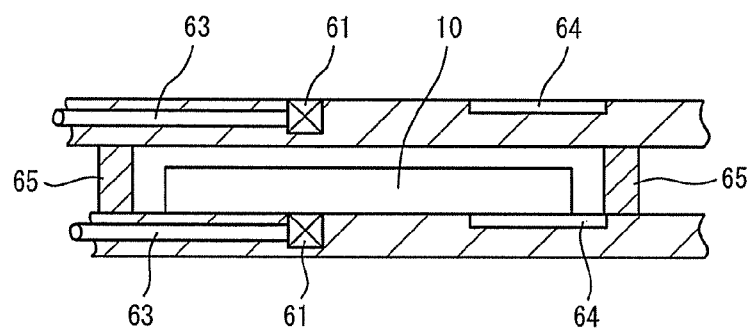
FIG. 6 is a vertical cross-sectional view showing a mechanism for supplying and discharging air to and from a reticle storage room.

FIG. 6 shows the inner case 10 stored in one of the reticle storage rooms 8. The storage room 8 is made substantially air-tight by walls 65 and a door, which will be described later, and the like. An air supply valve 61 is provided at an end of the air supply pipe 63 to feed clean gas into the inner case 10, and the clean gas is discharged into the storage room 8 via an exhaust groove 64. Upon the inner case 10 being placed on the valve 61, the valve 61 opens due to the weight of the inner case 10 or the like and feeds clean gas into the inner case 10.

Figure 7:
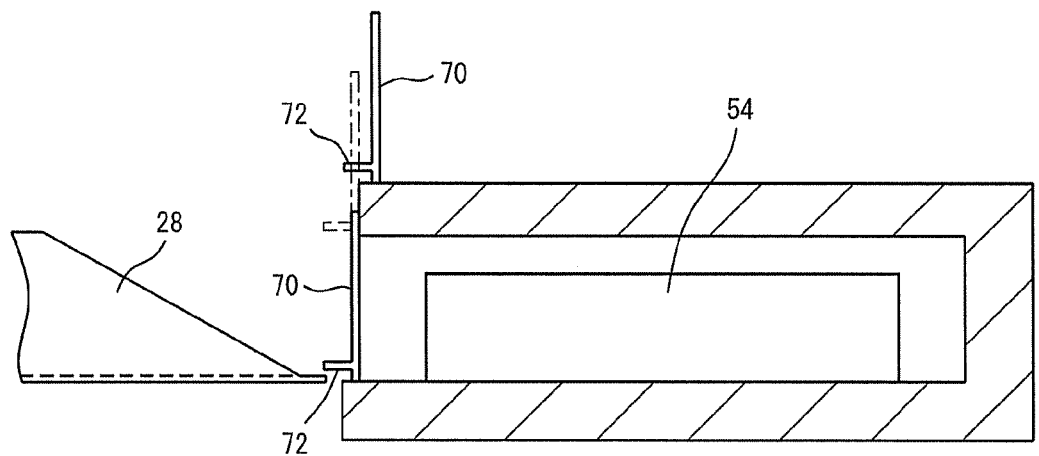
FIG. 7 is a vertical cross-sectional view showing a door of the pod storage room.

FIG. 7 schematically shows a door of the pod storage room 40. The door 70 is slidable in an up-down direction and provided with projection 72. The projection 72 is elevated by an inclined face or the like provided in the hand 28, and thus the door 70 opens and closes. A similar door is also provided in each reticle storage room 8, for example.

FIG. 8 shows a structure of the valve 57, and the valve 61 also has a similar structure, for example. A projection 80 protrudes from a floor surface of the pod storage room 40, and has an air supply opening 81 and a hole 82 that is in communication therewith. A valve body 83 is provided below the projection 80, and blocks the entry to a flow channel 86 due to an elastic member 84. Reference numeral 85 denotes a gas chamber, which is connected to a pipe for supplying clean gas. Upon a pod being placed on the valve 61, the valve body 83 lowers together with the projection 80, and thus, the gas chamber 85 comes into communication with the flow channel 86, and clean gas is fed from the air supply opening 81.

The embodiment achieves the following advantageous effects.

(1) Articles in the inner cases 10, the pods 54, and the like can be stored in an extremely clean state by protecting the surroundings of the reticle carousel 4 and the pod carousel 6 with down-flows of clean air and feeding clean gas to each storage room 8 and 40.

(2) Since down-flows of clean air are fed to the hands 28 and 29, the pod buffers 42, and the like, contamination can be prevented when the inner cases 10 and the pods 54 are handled with the hands 28 and 29 or the like, and when the pods 54 are stored in the pod buffers 42.

(3) A door is provided for each of the storage rooms 8 and 40, the storage rooms are substantially air-tight, and a channel for feeding clean gas is provided for each storage room. For this reason, the inside of the storage rooms can be kept clean with a small amount of clean gas.

(4) Clean gas is fed into the reticle storage rooms 8 and the pod storage rooms 40 due to the valve 57 and the like being opened by a mechanical mechanism. Accordingly, wiring on the shelves 9 and 41 is not necessary, and clean gas can be fed reliably. Note that clean gas may be supplied under the control of a controller (not shown), using an electromagnetic valve in place of the mechanical valve. However, this configuration will require wiring on the storage rooms 8 and 40.

(5) Since one pod 54 or one inner case 10 is stored in one storage room, the number of times that the door 70 or the like is opened is minimized, and the contamination of articles can be prevented.

(6) Due to the rotary joint 48, clean gas can be fed even if the storage rooms 40 and 8 are rotated.

LIST OF REFERENCE NUMERALS 2 storage unit
4 reticle carousel
6 pod carousel
8 reticle storage room
9, 41 shelf
10 inner case
12 shaft
14, 16 air supply pipe
18 base member
20 motor
22, 24 elevating member
25, 26 guide
28, 29 hand
30 outer wall
32 pod opening and closing unit
34 loading port
40 pod storage room
42 pod buffer
44 air supply pipe
45, 46 filter fan unit
48 rotary joint
49, 50 member
51, 52 air supply pipe
54 pod
55 intake valve
56 exhaust valve
57 valve
58, 63 air supply pipe
59, 64 exhaust groove
60, 65 wall
61 air supply valve
70 door
72, 80 projection 81 air supply opening
82 hole
83 valve body
84 elastic member
85 gas chamber
86 flow channel

What is claimed is:

1. A storage unit comprising:
a carousel including a plurality of levels and including a plurality of container storage spaces for storing a container on each level, the carousel rotating around a vertical axis;
a loading port for loading and unloading the container;
a transport unit for transporting the container between the loading port and the container storage spaces; and
a pipe configured to be connected to a first valve provided in a bottom surface of the container for feeding clean gas such that feeding is turned on and off for each container storage space,
the first valve being configured to open a flow channel for clean gas when pressure outside the container is higher than internal pressure of the container, and
the pipe including, at its end, a second valve configured to open a flow channel for clean gas as a result of coming into contact with the first valve,
wherein the second valve is provided in each container storage space at a position where the second valve contacts the first valve when the container is stored in the container storage space.

2. The storage unit according to claim 1, wherein said carousel is a first carousel, said storage unit further comprising:
a second carousel disposed above the first carousel so as to be superposed over the first carousel in a plan view, the second carousel rotating around a vertical axis independently of the first carousel, the second carousel including a plurality of levels and including a plurality of article storage spaces on each level, and the article storage spaces being able to be opened and closed;
a filter fan unit for feeding clean air in a down-flow manner from above the second carousel;
an opening and closing unit for bringing the article into and out of the container;
a second transport unit for transporting the article between the opening and closing unit and the second carousel;
a second pipe for feeding clean gas such that feeding is turned on and off for each article storage space; and
a storage unit housing.

3. The storage unit according to claim 2,
wherein the container storage space includes a door configured to be opened and closed by a hand of the transport unit for transporting the container,
wherein the article storage space includes a door configured to be opened and closed by a hand of the second transport unit for transporting the article, and
wherein the second pipe includes a third valve for opening a flow channel for clean gas as result of coming into contact with the article.

4. The storage unit according to claim 2, wherein both the second pipe and the first pipe are configured to be connected to the first valve provided in the container include rotary joints connected to a clean gas feeding source and downstream pipes branching from the rotary joints and supplying clean gas to the container storage spaces and the article storage spaces.

5. The storage unit according to claim 4, wherein both the first carousel and the second carousel include vertical shafts, and wherein the downstream pipes extend upward from below along the shafts.

6. A storage method of executing the following steps using a storage unit comprising: a carousel including a plurality of levels and including a plurality of container storage spaces for storing a container on each level, the carousel rotating around a vertical axis; a loading port for loading and unloading the container; a transport unit for transporting the container between the loading port and the container storage spaces; and a pipe for feeding clean gas to each container storage space,
the pipe including, at its end, a second valve configured to open a flow channel for clean gas when coming into contact with a first valve provided at in a bottom surface of the container, wherein the second valve is provided in each container storage space at a position where the second valve contacts the first valve when the container is stored in the container storage space,
the first valve being configured to open a flow channel for clean gas when pressure outside a container is higher than internal pressure of the container,
the method comprising:
a step for transporting a container accommodating a reticle or a semiconductor wafer and including the first valve at the bottom, between the loading port and the container storage spaces by the transport unit; and
a step for connecting the second valve at the end of the pipe to the first valve of the container stored in the container storage space, and feeding clean gas into the container by opening both the second valve and the first valve.

* * * * *